United States Patent [19]

Amann

[11] Patent Number: 5,325,379

[45] Date of Patent: Jun. 28, 1994

[54] TUNABLE LASER DIODE

[75] Inventor: Markus-Christian Amann, Munich, Fed. Rep. of Germany

[73] Assignee: Siemens Aktiengesellschaft, Munich, Fed. Rep. of Germany

[21] Appl. No.: 993,838

[22] Filed: Dec. 21, 1992

[30] Foreign Application Priority Data

Jan. 20, 1992 [EP] European Pat. Off. ........ 92100886.8

[51] Int. Cl.⁵ .............................................. H01S 3/10
[52] U.S. Cl. ......................................... 372/20; 372/50
[58] Field of Search ................................. 372/43–50, 372/20, 96

[56] References Cited

U.S. PATENT DOCUMENTS

| 3,805,188 | 4/1974 | Wuerker et al. | 372/19 |
| 4,435,809 | 3/1984 | Tsang et al. | 372/49 |
| 5,023,878 | 6/1991 | Berthold et al. | 372/20 |
| 5,048,049 | 9/1991 | Amann | 372/96 |
| 5,184,247 | 2/1993 | Schimpe | 359/344 |

FOREIGN PATENT DOCUMENTS

| 0360011 | 3/1990 | European Pat. Off. |
| 62173786 | 1/1988 | Japan |
| 3035581 | 4/1991 | Japan |
| 3105992 | 7/1991 | Japan |

OTHER PUBLICATIONS

An article entitled: "Fabrication and lasing characteristics of λ=1.56 μm tunable twin-guide (TTG) DFB lasers" by C. F. J. Schanen et al., IEE Proceedings-J, vol. 137, No. 1, Feb. 1990, pp. 69–73.

"Broadband Electronic Wavelength Tuning by CoDirectionally Coupled Twin-Guide Laser Diode", by S. Illek et al., ECOG 91/IOOC, 1991, pp. 21–24.

"Widely Tunable Y-Coupled Cavity Integrated Interferometric Injection Laser", by M. Schilling et al., Electronics Letters, Feb. 15, 1990, vol. 26, No. 4, pp. 243–244.

"Novel Structure GaInAsP/InP 1.5–1.5 μm Bundle Integrated-Guide (BIG) Distributed Bragg Reflector Laser", by Y. Tohmori et al., Japanese Journal of Applied Physics, vol. 24, No. 6, Jun. (1985), pp. L399–L401.

Primary Examiner—Frank Gonzalez
Attorney, Agent, or Firm—Hill, Steadman & Simpson

[57] ABSTRACT

Tunable laser diode, whereby two waveguide lasers (5, 7) are arranged transversely relative to one another. A separate current injection into each of the two waveguide layers (5, 7) is possible due to an intermediate layer (6) situated between these waveguide layers (5, 7). An absorber layer (4) periodically interrupted in a longitudinal direction is arranged transversely relative to the layer plane, resulting in forward coupling with an imaginary degree of coupling.

14 Claims, 4 Drawing Sheets

TUNABLE LASER DIODE

BACKGROUND OF THE INVENTION

The present invention is directed to a tunable laser diode based on a TTG laser diode.

Electronically tunable laser diodes having an extremely great tuning range are required in modern optical communications technology (for example, wavelength - division multiplex systems), in metrology (for example, in range-finding) and in sensor analysis (for example, air analysis with infrared spectroscopy). A tunable laser diode having an active layer and tuning layer arranged transversely relative to one another is disclosed in European Patent Application EP 0 360 011 (TTG laser). In the prior art, it was predominately hybrid designs composed of a laser diode and an external resonator with mechanical wavelength setting that were used for an especially broad tuning range. For example, the ACA laser or the Y laser are monolithically integrated designs. In the ACA laser (see ECOC'91/IOOC'91, pages 21-24), the principle of forward coupling is utilized for enlarging the tuning range. The longitudinal sectioning into three zones represents a disadvantage of the ACA laser, this making manufacture of the component more difficult and increasing the laser length. The Y laser (see M. Schilling et al., "Widely Tunable Y-Coupled Cavity Integrated Interferometric Injection Laser" in Electron. Lett. 26, 243-244 (1990)) has the critical disadvantage of an extremely complicated drive due to four control currents, whereby the control functions of light power and wavelength are not completely separated but are simultaneously influenced by all four control currents.

SUMMARY OF THE INVENTION

It is an object of the present invention to provide a tunable laser diode that can be simply manufactured and that has an especially wide tuning range.

This object is achieved with the laser diode that is a tunable laser diode, whereby a strip-shaped sequence of semiconductor layers arranged one upon another has a lower waveguide layer, an intermediate current injection layer, an upper waveguide layer, and an absorber layer. The intermediate current injection layer located between the upper and lower waveguide layer and the absorber layer is periodically interrupted in a longitudinal direction of the strip-shaped sequence.

Advantageous developments of the present invention are as follows.

The length of a period of the absorber layer amounts to at least 10 times the wavelength of the emission emitted by the laser diode in air.

The length of the period of the absorber layer is at least approximately equal to a quotient of a wavelength of the emission emitted by the laser diode in air and an amount of a difference between real parts of effective refractive indices of two coupled modes of the laser diode.

The waveguide layers are quaternary semiconductor materials and the absorber layer is a ternary semiconductor material.

The waveguide layers separated by the intermediate layer are located between a lower cladding layer and an upper cladding layer that contains the absorber layer. These layers are grown on a substrate on top of one another in a ridge-shaped arrangement. This ridge-shaped arrangement is laterally joined by a lateral cladding layer. The waveguide layers are undoped and the intermediate layer and the lateral cladding layer are doped for electrical conduction of a first conductivity type. The lower cladding layer, the upper cladding layer and the absorber layer are doped for electrical conduction of the second conductivity type. Separate first, second and third, contacts are provided, wherein the first contact is electrically and conductively connected to the lower cladding layer, the second contact is directly connected to the upper cladding layer and the third contact is directly connected to the lateral cladding layer.

Respective sections of a compensation layer are present in interruptions between sections of the absorber layer in order to keep real parts of effective refractive indices in the waveguide layers as constant as possible over the length of the laser diode.

In the laser diode of the present invention, two waveguide layers are arranged transversely parallel relative to one another according to the principle of the TTG laser diode. These waveguide layers can be separately driven via an intervening layer and separate contacts. Additionally, a periodically interrupted absorber layer is arranged in the proximity of this waveguide structure. Two different modes are guided in the waveguide layers. Both modes have their form influenced by the periodically successive presence or absence of the absorber layer, as a result whereof the field strength of these modes is influenced in different ways. This periodic disturbance of the otherwise uncoupled fields leads to a coupling of the two modes. Since the two modes run in the same direction, a co-directional coupling or forward coupling is present.

An important aspect of the present invention is that the degree of coupling is complex with a non-disappearing imaginary part. In the ideal case, the degree of coupling is purely imaginary. The degree of coupling is determined by the integral for the overlap of one respective mode in a region of the waveguide structure without an adjacent absorber layer with the respectively other mode in the region having an adjoining absorber layer. The imaginary part of this degree of coupling which differs from zero guarantees that a filter effect occurs during laser operation. Instead of effecting band filtration, a real part of this degree of coupling differing from zero causes a band stop, which would not be beneficial for laser operation because the wavelengths to be tuned would thereby be suppressed or would at least not be adequately amplified. This wavelength to be tuned is the coupling wavelength, i.e. the wavelength having maximum filter effect. It can be set in broad ranges with the current that effects a charge carrier injection into the waveguide layer provided for the tuning. The mechanism of this tuning is the variation of the refractive index for the waveguide layer provided for the tuning as a result of injected charge carriers. As known from the ACA laser diode, the size of the tuning range is only limited by the material-dependent width of the laser amplification curve due to the forward coupling given optimum dimensioning.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
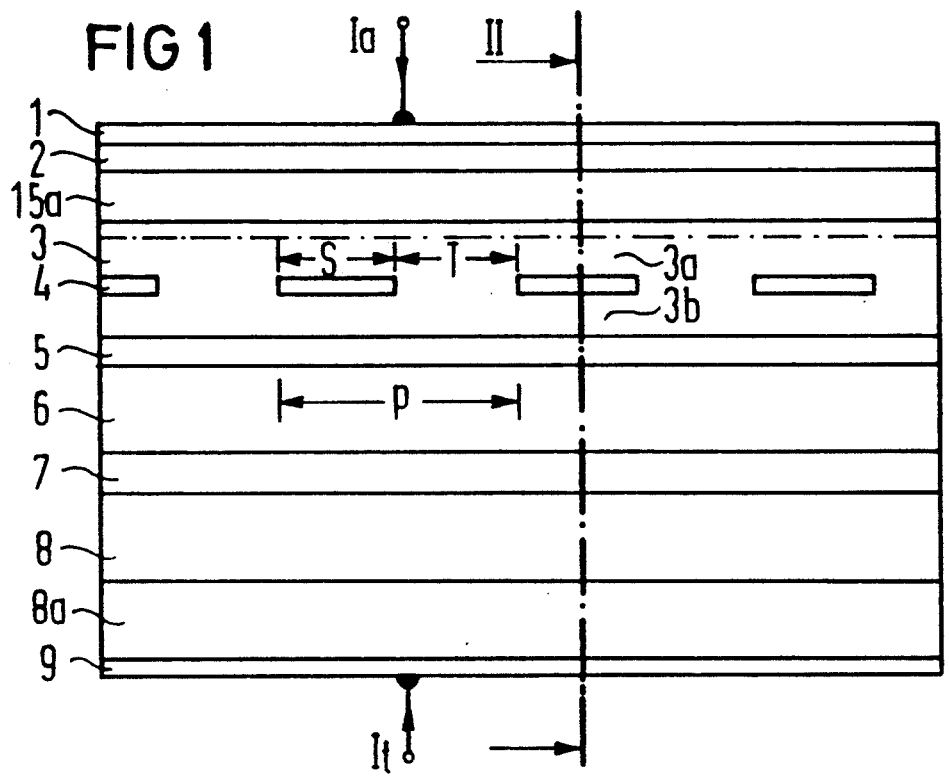
FIG. 1 shows a laser diode of the present invention in a longitudinal section.
Figure 2:
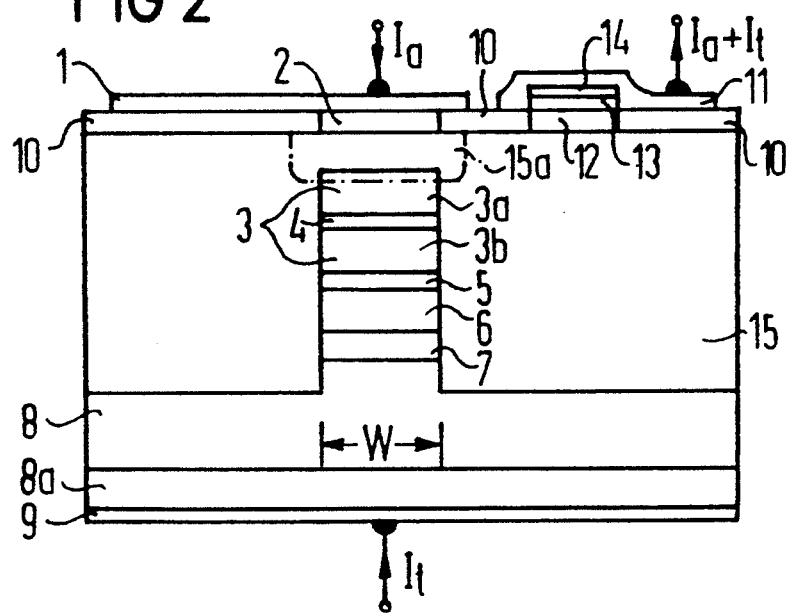
FIG. 2 shows a laser diode of the invention in the cross section identified in FIG. 1.

In the longitudinal section in FIG. 1 and the appertaining cross section in FIG. 2, the waveguide layers 5, 7, the intermediate layer 6 and the absorber layer 4 with periodic interruptions are depicted. The lateral structure, as shown in FIG. 2, is inherently already known from the TTG laser and is only intended to serve here as an example for the realization of the lateral current and wave guidance. Other suitable lateral structures, however, can just as well be employed. What is the ruling factor for the present invention, however, is the axial structure of the laser resonator, as shown in FIG. 1. The length S of the respective sections of the absorber layer and the length T of the respective interruptions add up to form the period P. In the specific exemplary embodiment as shown in FIG. 1, a lower cladding layer 8, a lower waveguide layer 7, the intermediate layer 6, an upper waveguide layer 5 and an upper cladding layer 3 having absorber layer 4 embedded therein are grown on top of one another on a substrate 8a. These layers form a ridge, as may be seen in FIG. 2. The lateral regions on the lower cladding layer 8 are filled up by a lateral cladding layer 15. This lateral cladding layer 15 can completely cover the ridge.

The waveguide layers 5, 7 are preferably undoped. The intermediate layer 6 is doped electrically conductive for a first conductivity type. The layers downwardly and upwardly adjoining the waveguide layers 5, 7 are respectively doped electrically conductive for the second conductivity type. The lateral cladding layer 15 is doped for the conductivity type of the intermediate layer 6. If the ridge is completely overgrown by this lateral cladding layer, a terminal region 15a having the same operational sign as the upper cladding layer is formed above the ridge in this lateral cladding layer 15 by diffusion or implantation.

A contact layer 2 that is laterally limited by insulator layers 10 is applied strip-shaped above the ridge on the upper cladding layer 3 or on the terminal region 15a. A central contact 1 is located on this contact layer 2. An intermediate layer 12, an etch stop layer 13 and a lateral contact layer 14 are applied above one another strip-shaped on the lateral cladding layer 15 laterally from the ridge. This lateral contact layer 14 is provided with a lateral contact 11. The lateral insulation is provided by insulator layers 10. A cooperating contact 9 is electrically connected to the lower cladding layer 8 (for example, by the electrically conductive doped substrate 8a). The terminal region 15a is indicated by the dot-dashed line in FIGS. 1 and 2. An upper part 3a and a lower part 3b of the upper cladding layer 3 above or below a respective section of the absorber layer 4 are separately provided with reference characters in these drawings.

Figure 6:
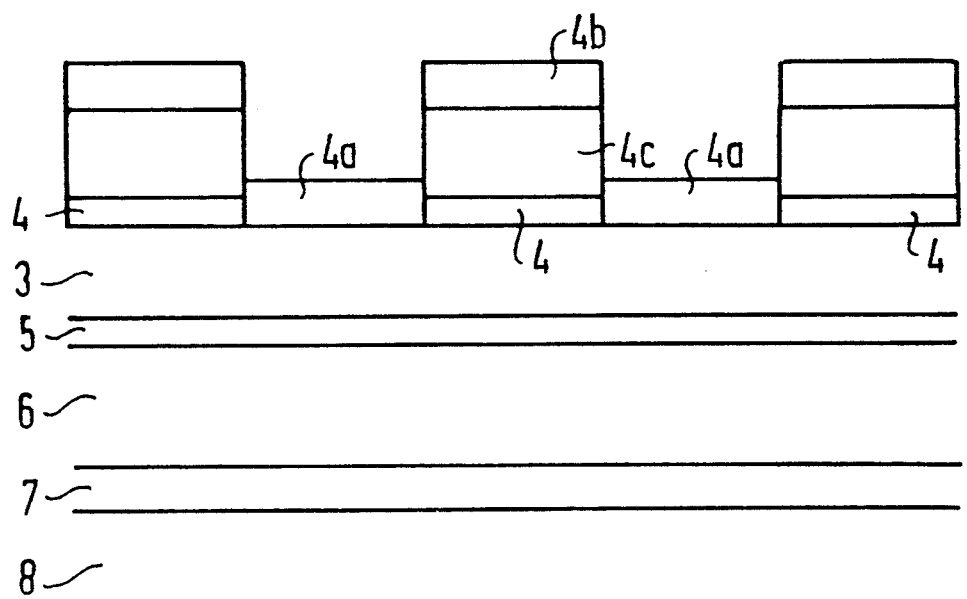

The following table contains typical data of a laser diode structure of the present invention on a p-substrate (in this respect, see FIGS. 1, 2 and 6 ).

Entered following the reference numeral of the respective layer or zone is the respective thickness in $\mu$m, the function of this layer, and the composition and doping height of the material.

| Layer/ Zone | Thickness ($\mu$m) | Function | Composition; Operational Sign; Height of the Doping |
|---|---|---|---|
| 1 | 0.5 | p-laser contact | Ti/Pt/Au (p-contact) |
| 2 | 0.2 | p$^+$-contact layer | $Q_{1,3}$; P; $5 \times 10^{19}$ cm$^{-3}$ |
| 3 | 2.23 | p-cladding layer | InP; P; $5 \times 10^{17}$ cm$^{-3}$ |
| 3a | 2.0 | p-cladding layer | InP; P; $5 \times 10^{17}$ cm$^{-3}$ |
| 3b | 0.2 | p cladding layer | Inp; P; $5 \times 10^{17}$ cm$^{-3}$ |
| 4 | 0.03 | Absorber-layer | InGaAs; P; $10^{18}$ cm$^{-3}$ |
| 4a, 4b | 0.05 | compensation layer | $Q_{1,3}$; P; $5 \times 10^{17}$ cm$^{-3}$ |
| 4c | 1.0 | spacer layer | InP or $Q_g$(g < 1.3); p; $5 \times 10^{17}$ cm$^{-03}$ |
| 5 | 0.25 | waveguide layer | $Q_{1,55}$ undoped |
| 6 | 0.4 | intermediate layer | InP; n; $3 \times 10^{18}$ cm$^{-3}$ |
| 7 | 0.15 | waveguide layer | $Q_{1,3}$ undoped |
| 8 | 1.0 | p-cladding layer | InP; P; $5 \times 10^{17}$ cm$^{-3}$ |
| 8a | 100 | p-substrate | InP; p; $5 \times 10^{18}$ cm$^{-3}$ |
| 9 | 0.5 | p-tuning contact | Au/Zn/Au/Pt/Au |
| 10 | 0.2 | insulator | Al$_2$O$_3$ |
| 11 | 0.5 | n-contact | Ti/Pt/Au |
| 12 | 0.2 | intermediate contact | $Q_{1,3}$; n; $1 \times 10^{18}$ cm$^{-3}$ |
| 13 | 0.1 | etch stop layer | InP; n; $1 \times 10^{18}$ cm$^{-3}$ |
| 14 | 0.2 | n$^+$-contact layer | InGaAs; n; $5 \times 10^{19}$ cm$^{-3}$ |
| 15 | 4.0 | lateral cladding layer | InP; n; $2 \times 10^{18}$ cm$^{-3}$ |
| 15a | 0.5 | p$^+$-terminal region | InP; p; $3 \times 10^{18}$ cm$^{-3}$ |

In this table, Q respectively denotes quaternary material, whereby the index is the corresponding wavelength and, thus, the energy band gap. In this exemplary embodiment, the upper waveguide layer 5 is fashioned as an active layer and the lower waveguide layer 7 is fashioned as a tuning layer. The absorber layer 4 is arranged above the upper waveguide layer 5. Instead, the absorber layer 4 can be arranged between the waveguide layers 5, 7, i.e. embedded in the intermediate layer 6 or can be arranged under the lower waveguide layer 7, i.e. on the side facing toward the substrate. Likewise, the sequence of the waveguide layers 5, 7 can be reversed (tuning layer at the top, active layer at the bottom). The operational sign of the doping can be reversed in comparison to the particulars in the table. The functions of the central contact 1 and the cooperating contact 9 are then likewise interchanged, i.e. the central contact 1 is the tuning contact and the cooperating contact 9 is the laser contact.

The recited compensation layer 4a, 4b and the spacer layer 4c serve the purpose of keeping the real part of the refractive index in the waveguide layers 5, 7 constant over the length of the laser diode and shall be set forth later with reference to FIGS. 5 and 6. The control current for the active layer for generating the laser emission is referenced $I_a$, and the current for tuning is referenced $I_t$. The period P of the absorber layer 4 (FIG. 1) is composed of a respective section of this absorber layer 4 having the length S and a respective interruption having the length T. The period is calculated from the effective (real) refractive indices $N_{e1}$ and $N_{e2}$ of the two, coupled modes and the wavelength $\lambda$, being calculated as $$P = \left| \frac{\lambda}{N_{e1} - N_{e2}} \right| \quad (1)$$

whereby the difference $|N_{e1}-N_{e2}|$ typically amounts to 0.1. As shown in the figure, it is possible to select S=T. The lengths S and T, however, can also be different, which will usually be advantageous given the laser diode of the present invention. When the laser diode is composed of InGaAsP and operates at a wavelength of 1.55 μm, the period P is typically approximately 20 μm.

The mirror end faces of the laser, i.e. the edges of the laser diode depicted at the left and right in FIG. 1, should be arranged such that the sub-sections of the absorber layer 4 or the interruptions thereof are respectively cut off in the middle. As entered in FIG. 1, a section of the absorber layer 4 can be halved by the mirror end face at one end of the laser diode and the mirror end face can be arranged at the other side at a distance of half an interruption from a section of the absorber layer 4. Alternatively, the mirror end faces at both ends can respectively have a section of the absorber layer 4 or can proceed at both ends at the spacing of half an interruption from a section of the absorber layer 4. The width W of the ridge-shaped arrangement of the layers advantageously amounts to approximately 1 through 2 μm.

Figure 3:
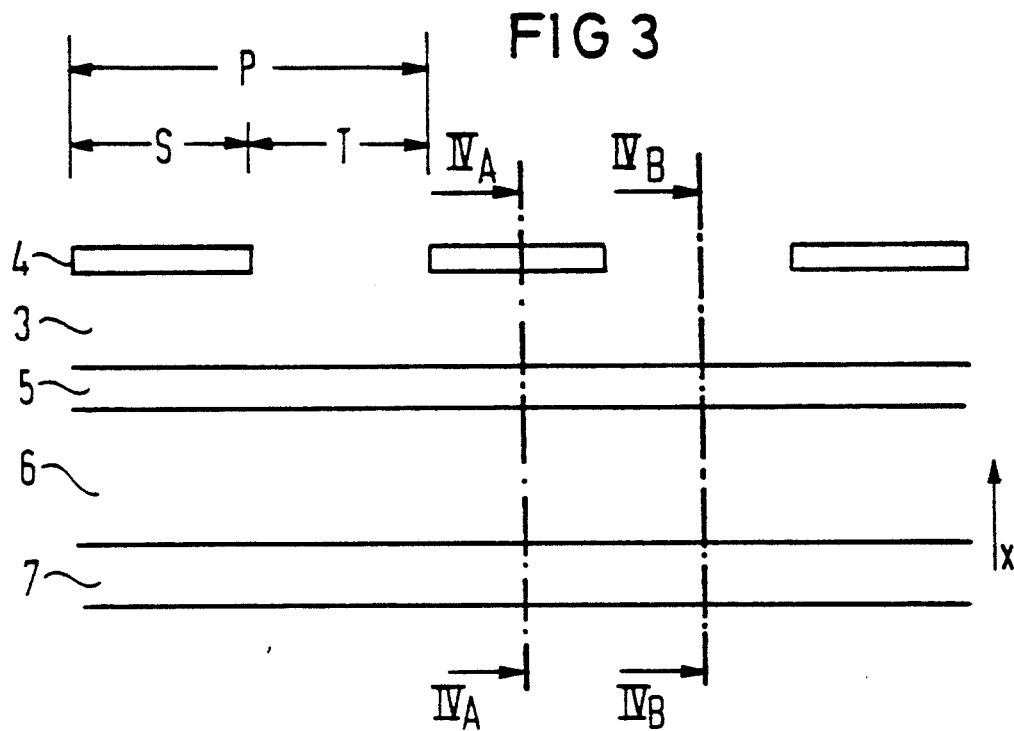
FIG. 3 shows a portion of the longitudinal section shown in FIG. 1.
Figure 4:
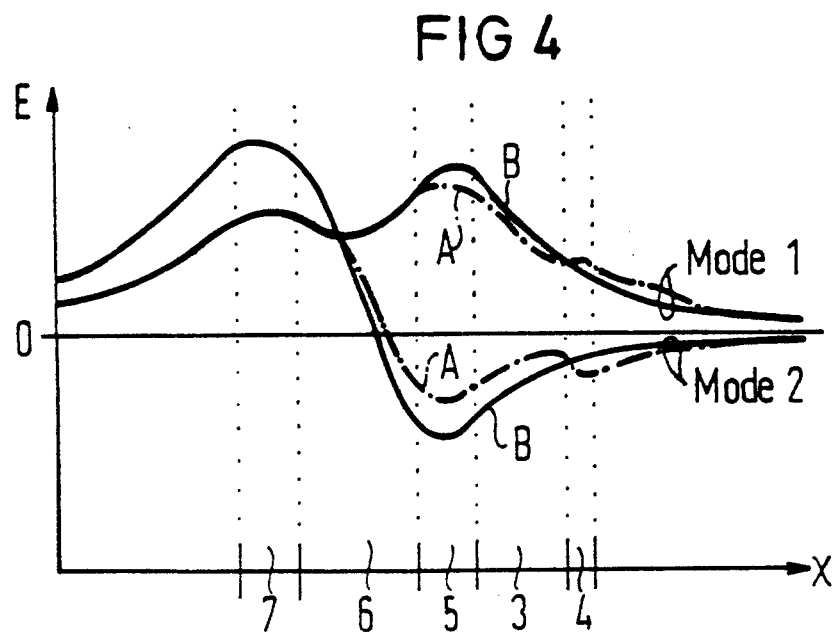
FIG. 4 qualitatively shows the curve of the field strength relative to the layer structure in a vertical direction.

FIG. 3 shows a portion of the longitudinal section of FIG. 1. In FIG. 3, two planes of section A and B are entered. The field strength E (for example E-field component perpendicular to the plane of the drawing) of the two coupled modes 1 and 2 is entered in the vertical x direction in FIG. 4 for these two planes of section dependent on the location. The solid curves respectively refer to the section B in the region wherein the absorber layer 4 is interrupted. The dot-dashed curve shows the field strength in the region of the absorber layer 4 (section A). The change of the field strength in the region of the absorber layer 4 effects the coupling with an imaginary part of the degree of coupling disappearing from zero.

Figure 5:
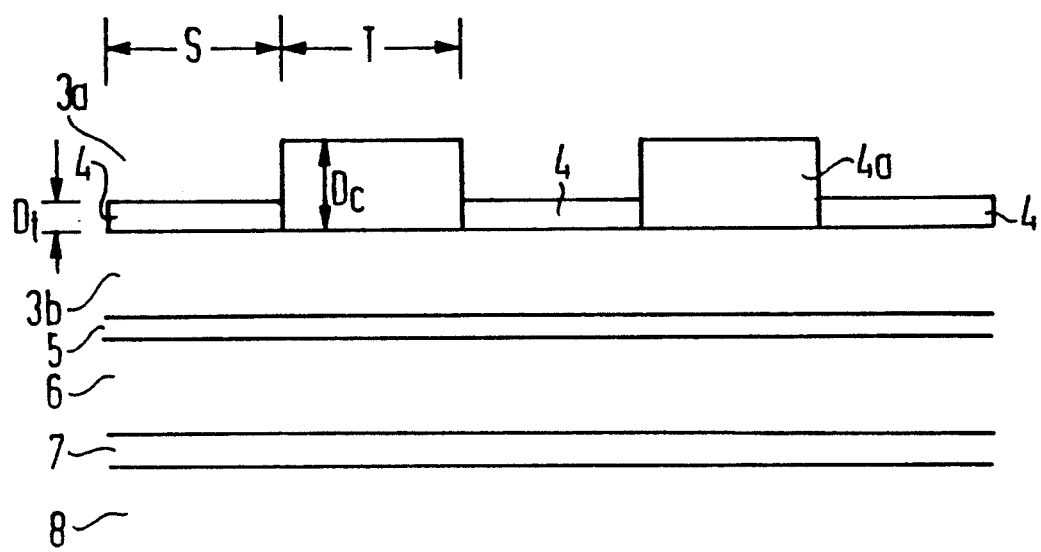
FIGS. 5 and 6 show a portion of the longitudinal section according to FIG. 1 with additional compensation layers.

FIGS. 5 and 6 show respective longitudinal sections wherein the interruptions between the sections of the absorber layer 4 are respectively filled by parts of a compensation layer 4a. A significant feature of the present invention is the practical realization of an imaginary coupling degree due to the absorber layer 4. The standard semiconductor materials that can be utilized for such an absorber layer 4, however, not only change the imaginary part of the refractive index in the waveguide layers (which is required for achieving the imaginary degree of coupling) but also change the real part of the effective refractive index. The change of the real part of the refractive index must therefore be eliminated by a compensation, so that the absorber layer 4 produces an exclusively imaginary change of the refractive index and, thus, of the degree of coupling in the ideal case. This can occur by filling up the regions between the sections of the absorber layer 4 with material having a higher refractive index than the upper cladding layer 3, whereby this material, however, is not absorbent. This is fundamentally known from the BIG laser (see, for example, Y. Tohmori et al., "Novel Structure GaInAsP/InP 1.5-1.6 μm Bundle Integrated-Guide (BIG) Distributed Bragg Reflector Laser" in Jap. J. Appl. Phys. 24, L399-L401 (1985)). The compensation layer 4a should be optimally present at the same spacing from the waveguide layer 5 as the absorber layer 4. The thickness $D_c$ of this compensation layer 4a should approximately have the value that approximately derives from the following equation with the thickness $D_t$ of the absorber layer 4:

$$D_c(N_{4a}-N_3) = D_t(N_4-N_3), \quad (2)$$

where $N_n$ is the real part of the refractive index of the layer provided with the reference character n.

The arrangement of FIG. 5 can, for example, be manufactured by selective epitaxy. After the absorber layer 4 is manufactured, i.e. after the surface-wide growth with following etching of the interruptions, this absorber layer 4 is covered by masks and the interruptions are filled with the compensation layer 4a. One can manage without selective epitaxy when one realizes the structure of FIG. 6. A spacer layer 4c is thereby grown surface-wide in addition to the absorber layer 4. The absorber layer and this spacer layer 4c are etched out in common in the regions of the interruptions of the absorber layer 4. The compensation layer 4a, 4b is subsequently grown surface-wide, whereby the portions 4b of the compensation layer on the portions of the spacer layer 4c are at such a distance from the waveguide layers 5, 7 that a change of the real part of the effective refractive index practically does not appear in these waveguide layers 5, 7. This layer composed of the absorber layer 4 and the compensation layer 4a is grown over surface-wide with the upper part 3a of the upper cladding layer 3 and is planarized.

What is important for the laser diode of the present invention is a pronounced, narrow filter curve, i.e. the relative optical gain in the unit of a reciprocal path length entered over the wavelength. The height of this filter curve and the width thereof are respectively proportional to the imaginary part of the degree of coupling given a purely imaginary degree of coupling. The height of the filter curve is additionally proportional to the difference between the effective refractive indices for the two modes in the waveguide layers. The filter curve is thus noticeably steeper than the wavelength dependency produced by the material gain. This enables variation of the frequency or wavelength on the basis of the forward coupling via the current $I_t$. The tuning with $I_t$ varies the refractive index of the waveguide layer 7 due to the charge carrier injection. A change in the refractive index, however, is also possible upon utilization of the quantum confined Stark effect when the waveguide layer 7 has a quantum well structure. Given inhibit poling of the cooperating contact 9, the refractive index is then reduced without having a current flow ($I_t=0$). The change in the refractive index in the waveguide layer 7 influences the effective refractive indices $N_{e1}$ and $N_{e2}$ of the two modes 1 and 2 in different ways, so that, according to equation (1), the relative wavelength changes are proportional to the relative change of the difference $|N_{e1}-N_{e2}|$ as a consequence of the constant period P. The period P of the absorber layer 4 is approximately 10 times through 100 times greater than the period of a DFB grating.

The laser diode of the present invention can also be fundamentally realized by substitution of the absorber layer 4 by an amplifying layer. Likewise, the waveguide layer 5 can be divided into two or more layers, whereby the waveguide function can be partially assumed by non-amplifying layers (for example $Q_{1.3}$ when $\lambda = 1.55$ μm).

Figure 7:
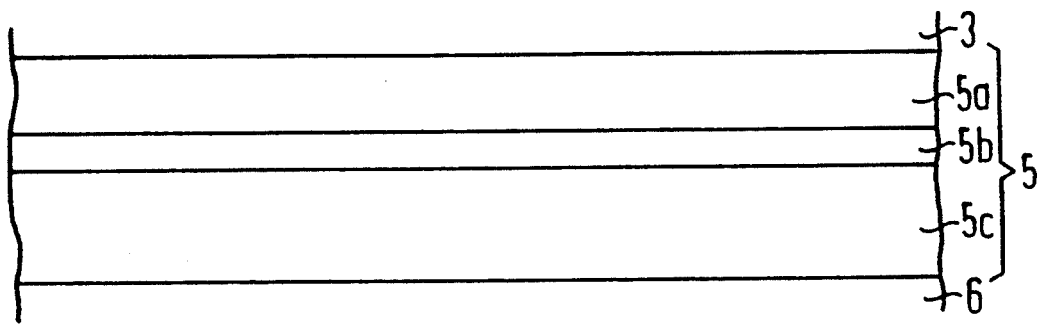
FIGS. 7 and 8 show portions of longitudinal sections of alternative embodiments.
Figure 8:
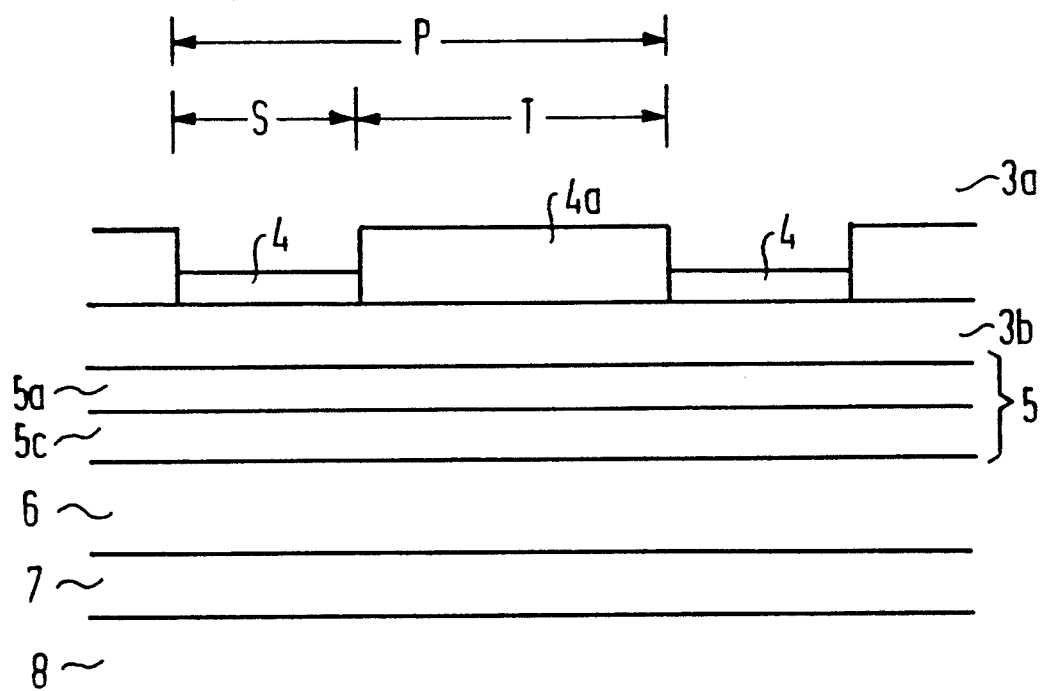

Such an embodiment, for example, is shown excerpted in FIG. 7. Layer 5a corresponds to the original layer 5 in terms of its composition, whereas layer 5b can be composed, for example, like the upper cladding layer 3 and layer 5c is composed, for example, of quaternary material ($Q_{1.3}$, n-doped). Typical layer thicknesses are 0.1 μm, 0.05 μm and 0.2 μm for the layers 5a, 5b, 5c. FIG. 8 shows a longitudinal section corresponding to FIG. 5 through an alternative exemplary embodiment having layers 5a and 5c instead of the waveguide layer 5 shown in FIG. 5. The thicknesses of the layers 4, 4a, 5a, 5c, 6 and 7 are 0.07 μm, 0.15 μm, 0.15 μm, 0.2 μm, 0.3 μm and 0.2 μm, respectively. The material composition of the layer 5a is the same of that of the layer 5. The layer 5c is quaternary material ($Q_{1.3}$), n-conductively doped with $5 \times 10^{17}$ cm$^{-3}$ density. This exemplary embodiment is for the wavelength 1.55 μm and the dimensions W = 1.5 μm, P = 15.5 μm, S = 4.5 μm and T = 11 μm. The particulars for the other layers may be taken from the above table.

The important features of the laser diode of the present invention are the transversal, double waveguide structure, the periodically interrupted absorber layer arranged transversely relative thereto and the forward coupling of two different modes effected as a result thereof. The arrangement and doping of the layers for a separate current injection into the two waveguide layers as well as the dimensions of the layers can be varied within broad limits in individual exemplary embodiments. A multitude of different laser diodes that are simple to manufacture and can be tuned broadband are thus obtained in a simple way.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A tunable laser diode, comprising: a strip-shaped sequence of semiconductor layers arranged one upon another and having a lower waveguide layer, an intermediate current injection layer, an upper waveguide layer, and an absorber layer; said intermediate current injection layer located between said upper and lower waveguide layers and said absorber layer being periodically interrupted in a longitudinal direction of the strip-shaped sequence.

2. The laser diode according to claim 1, wherein a length of a period of the absorber layer is at least 10 times a wavelength of emission emitted by the laser diode in air.

3. The laser diode according to claim 1, wherein a length of a period of the absorber layer is at least approximately equal to a quotient of a wavelength of emission emitted by the laser diode in air and an amount of a difference between real parts of effective refractive indices of two coupled modes of the laser diode.

4. The laser diode according to claim 1, wherein the waveguide layers are quaternary semiconductor materials and the absorber layer is ternary semiconductor material.

5. The laser diode according to claim 1, wherein the laser diode further comprises: a lower cladding layer under the lower waveguide layer and an upper cladding layer on the upper waveguide layer and, said upper cladding layer containing said absorber layer, the waveguide layers that are separated by the intermediate layer between the lower cladding layer and the upper cladding layer and the absorber layer being grown on a substrate on top of one another in a ridge-shaped arrangement;

a lateral cladding layer laterally joining said ridge-shaped arrangement;

the waveguide layers being undoped;

the intermediate layer and the lateral cladding layer being doped for electrical conduction of a first conductivity type;

the lower cladding layer, the upper cladding layer and the absorber layer being doped for electrical conduction of a second conductivity type; and separate first, second and third contacts, said first contact being electrically connected to the lower cladding layer, said second contact being electrically connected to the upper cladding layer and said third contact being electrically connected to the lateral cladding layer.

6. The laser diode according to claim 1, wherein the laser diode further comprises a compensation layer having respective sections thereof located in the interruptions of the absorber layer for keeping real parts of effective refractive indices in the waveguide layers substantially constant over a length of the laser diode.

7. A tunable laser diode, comprising: a strip-shaped sequence of semicondcutor layers arranged one upon another and having a lower waveguide layer, an intermediate current injection layer, an upper waveguide layer, and an absorber layer; said intermediate current injection layer located between said upper and lower waveguide layers and said absorber layer being periodically interrupted in a longitudinal direction of the strip-shaped sequence; and a length of a period of the absorber layer being approximately equal to a quotient of a wavelength of emission emitted by the laser diode in air and an amount of difference between real parts of effective refractive indices of two coupled modes of the laser diode.

8. The laser diode according to claim 7, wherein the waveguide layers are quaternary semiconductor materials and the absorber layer is ternary semiconductor material.

9. The laser diode according to claim 7, wherein the laser diode further comprises: a lower cladding layer under the lower waveguide layer and an upper cladding layer on the upper waveguide layer and, said upper cladding layer containing said absorber layer, the waveguide layers that are separated by the intermediate layer between the lower cladding layer and the upper cladding layer and the absorber layer being grown on a substrate on top of one another in a ridge-shaped arrangement;

a lateral cladding layer laterally joining said ridge-shaped arrangement;

the waveguide layers being undoped;

the intermediate layer and the lateral cladding layer being doped for electrical conduction of a first conductivity type;

the lower cladding layer, the upper cladding layer and the absorber layer being doped for electrical conduction of a second conductivity type; and separate first, second and third contacts, said first contact being electrically connected to the lower cladding layer, said second contact being electrically connected to the upper cladding layer and said third contact being electrically connected to the lateral cladding layer.

10. A tunable laser diode, comprising:

a strip-shaped sequence of semiconductor layers arranged one upon another and having a lower waveguide layer, an intermediate current injection layer, an upper waveguide layer, and an absorber layer, said intermediate current injection layer located between said upper and lower waveguide layers and said absorber layer being periodically interrupted in a longitudinal direction of the strip-shaped sequence;

a lower cladding layer under the lower waveguide layer and an upper cladding layer on the upper waveguide layer, said upper cladding layer containing said absorber layer, the waveguide layers that are separated by the intermediate layer, the lower cladding layer, the upper cladding layer and the absorber layer being grown on a substrate on top of one another in a ridge-shaped arrangement;

a lateral cladding layer laterally joining said ridge-shaped arrangement;

the waveguide layers being undoped;

the intermediate layer and the lateral cladding layer being doped for electrical conduction of a first conductivity type;

the lower cladding layer, the upper cladding layer and the absorber layer being doped for electrical conduction of a second conductivity type; and separate first, second and third contacts, said first contact being electrically connected to the lower cladding layer, said second contact being electrically connected to the upper cladding layer and said third contact being electrically connected to the lateral cladding layer.

11. The laser diode according to claim 10, wherein a length of a period of the absorber layer is at least 10 times a wavelength of emission emitted by the laser diode in air.

12. The laser diode according to claim 10, wherein a length of a period of the absorber layer is at least approximately equal to a quotient of a wavelength of emission emitted by the laser diode in air and an amount of a difference between real parts of effective refractive indices of two coupled modes of the laser diode.

13. The laser diode according to claim 1, wherein the waveguide layers are quaternary semiconductor materials and the absorber layer is ternary semiconductor material.

14. The laser diode according to claim 10, wherein the laser diode further comprises a compensation layer having respective section thereof located in the interruptions of the absorber layer for keeping real parts of effective refractive indices in the waveguide layers substantially constant over a length of the laser diode.

* * * * *